United States Patent [19]

Huss et al.

[11] Patent Number: 4,975,824
[45] Date of Patent: Dec. 4, 1990

[54] POWER CONVERTER CIRCUIT BOARD

[75] Inventors: John Huss; Richard J. Hoppe, both of Rockford; Lawrence E. Crowe, Lindenwood; Thomas Sutrina; Eric D. Lakin, both of Rockford, all of Ill.

[73] Assignee: Sundstrand Corporation, Rockford, Ill.

[21] Appl. No.: 448,313

[22] Filed: Dec. 11, 1989

[51] Int. Cl.$^5$ .............................................. H01M 1/00
[52] U.S. Cl. ..................................... 363/132; 363/141; 363/144
[58] Field of Search ...................... 363/132, 141, 144; 361/410, 414, 381, 388, 395; 174/255, 262, 263, 266

[56] References Cited

U.S. PATENT DOCUMENTS

| | | | |
|---|---|---|---|
| 4,399,486 | 8/1983 | Petsch | 361/386 |
| 4,458,305 | 7/1984 | Buckle et al. | 363/144 |
| 4,631,573 | 12/1986 | Sutrina | 361/381 |
| 4,636,919 | 1/1987 | Itakura et al. | 361/414 |
| 4,670,833 | 6/1987 | Sachs | 363/132 |
| 4,734,315 | 3/1988 | Spence-Bate | 361/383 |
| 4,872,102 | 10/1989 | Getter | 363/141 |

Primary Examiner—William H. Beha, Jr.
Attorney, Agent, or Firm—Marshall, O'Toole, Gerstein, Murray & Bicknell

[57] ABSTRACT

Prior power converters have utilized discrete components mounted on circuit boards of different design. Failure of one or more of the components requires the components to be separately tested to determine which is faulty. The faulty component or the board containing same must then be replaced. This results in significant down time for the inverter and can require stocking of a large number of specialized boards. In order to overcome these problems, an inverter is assembled using a series of circuit boards of standardized type. Each circuit board includes separate layers which interconnect components mounted thereon together with a heat exchanger which cools high power components. When a malfunction of a component occurs, the entire board may be replaced so that inverter down time is minimized. Also, the use of standardized boards reduces stocking requirements and inventory costs.

3 Claims, 10 Drawing Sheets

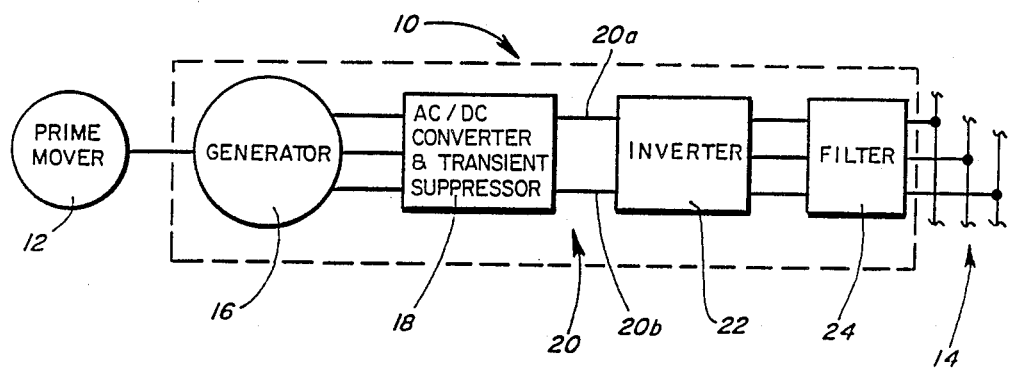
FIG. 1
FIG. 3
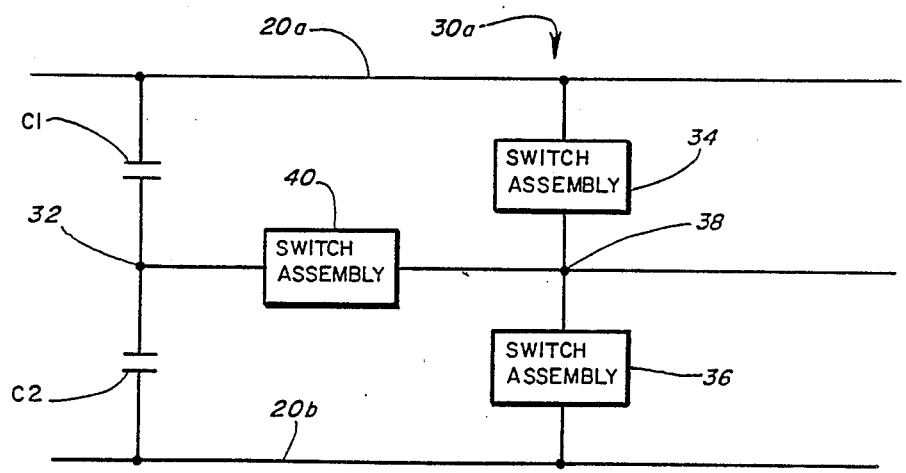

POWER CONVERTER CIRCUIT BOARD

TECHNICAL FIELD

The present invention relates generally to power converters, and more particularly to a circuit board for a power converter.

BACKGROUND ART

In a variable-speed, constant-frequency (VSCF) power generating system, variable-frequency power produced by a brushless, synchronous generator is converted by a power converter into constant-frequency AC power. The power converter includes a rectifier bridge which converts the variable-frequency power into DC power on DC link conductors and an inverter which converts the DC power into the constant-frequency AC power. The inverter may be, for example, of the neutral point clamped type wherein positive and negative switch assemblies are connected in series across the DC link conductors and wherein a neutral switch assembly is connected between a neutral voltage and a junction between the positive and negative switch assemblies.

In general, each of the positive and negative switch assemblies includes driver and driven transistors connected together in a Darlington configuration together with associated base biasing, snubber and flyback components connected thereto. The neutral switch assembly includes all of these components with the exception of a flyback diode across the driven transistors. Also, the neutral switch assembly requires four high power diodes connected in a bridge configuration which permit bi-directional current flow between the neutral voltage and the phase output. The neutral switch assembly thus requires three additional power diodes as compared with each of the positive and negative switch assemblies.

The components of each switch assembly handle large magnitudes of current and are subject to failure. Such a failure may cause harmonic content in the inverter output to increase beyond acceptable limits or may render the entire inverter inoperative. In such a case, it is necessary to shut down the inverter in order to isolate and replace the failed component. The process of isolating the failed component can be lengthy, in turn leading to significant down time for the inverter.

The process of isolating a failed component can be shortened considerably by packaging each of the switch assemblies as a separate unit, such as on a single printed circuit board. Thus, for each inverter leg, only three components, (i.e. each switch assembly) need be tested in order to isolate a failed component. Once the failure is isolated to a single board, the entire board can be replaced and the faulty board repaired "off-line". While this approach minimizes the time that an inverter is out of service, it requires that at least two different sets of boards be used, one for the positive and negative switch assemblies and one for the neutral switch assembly. This, in turn, increases the number of boards which must be stocked for replacement purposes.

SUMMARY OF THE INVENTION

In accordance with the present invention, an inverter includes a plurality of switch assemblies formed by components mounted on standardized circuit boards.

Generally, a circuit board according to the present invention comprises a substrate having a main layer including an electrically conductive portion and an electrically non-conductive portion adjacent thereto, the substrate having first and second opposite faces wherein the electrically conductive and non-conductive portions extend substantially the entire distance from the first face to the second face. A layer of insulating material is disposed on one side of the first and second faces and an electrically conductive component, such as a conductive trace, is disposed on the layer of insulating material. Means including via holes extend through the layer of insulting material for coupling the electrically conductive component to the electrically conductive portion of the substrate.

In a more specific sense, the circuit board main layer includes a plurality of spaced copper sections with electrically non-conductive filler therebetween. Electrically insulating layers are deposited on first and second sides of the main layer. One or more planar thermofoil resistors are disposed on one of the insulating layers and a further electrically insulating layer is deposited on the resistors. An electrically conductive heat exchanger is disposed on the last-named insulating layer.

Disposed on the other insulating layer is a series of traces comprising printed strips of electrically conductive material. A still further insulating layer is deposited atop the trace layer. Via holes and apertures are formed in the various layers to allow connection to various components. The assembled components described above form a circuit board blank and components may be added to three of the blanks to form positive, negative and neutral switch assemblies.

The design of the board permits the positive, negative and neutral switch assemblies to be stacked next to one another so that the size of the resulting inverter is minimized. Cooling fluid is provided to the heat exchangers so that heat is effectively removed even from components located in the inner board or boards intermediate the ends of the stack. Thus, a large number of heat-producing components can be assembled within a small space without damage due to heat build-up.

A faulty inverter due to failure of a component on a particular board can be easily repaired by appropriately configuring a blank board and by substituting the configured board for the board containing the failed component. Since the positive, negative and neutral switch assemblies are assembled using identical board blanks, there is no need to manufacture and stock different board types to allow any switch assembly to be replaced.

BRIEF DESCRIPTION OF THE DRAWINGS

FIG. 1 comprises a block diagram of a variable-speed, constant frequency power generating system in conjunction with a prime mover;

FIG. 3 comprises a block diagram of one leg of the inverter shown in FIG. 2;

DESCRIPTION OF THE PREFERRED EMBODIMENT

Figure 2:
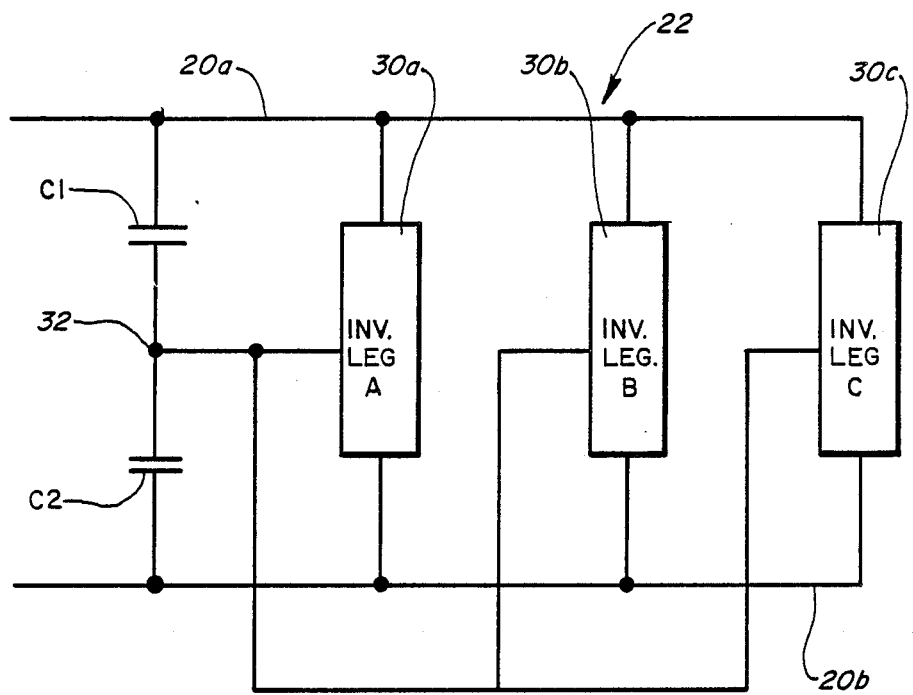
FIG. 2 comprises a block diagram of the inverter shown in FIG. 1.

Referring now to FIG. 1, a variable-speed, constant-frequency (VSCF) power generating system 10 converts variable-speed motive power produced by a prime mover 12, such as an aircraft jet engine, into constant-frequency AC electrical power on a load bus 14. It should be noted that various contactors which connect the VSCF system 10 to the load bus 14 are not shown for the sake of simplicity.

The VSCF system 10 includes a brushless, synchronous generator 16 which converts the variable-speed motive power produced by the prime mover 12 into variable-frequency AC power. This AC power is converted by an AC/DC converter and transient suppressor 18 into DC power on a DC link 20 including DC link conductors 20a, 20b. A DC link filter (not shown) may be provided to minimize ripple in the DC power on the DC link 20. The inverter 22 converts the DC power into constant-frequency AC power which is filtered by an optional filter 24 and provided to the AC bus 14.

Referring now to FIG. 2, the inverter 22 is preferably, although not necessarily, of the three-phase type including first through third inverter legs 30a, 30b and 30c which are coupled to the DC link conductors 20a, 20b and a neutral terminal 32 at which a neutral voltage is produced. The neutral terminal comprises the junction between first and second capacitors C1 and C2 coupled across the DC link conductors 20a, 20b.

FIG. 3 illustrates the inverter leg 30a in greater detail, it being understood that the legs 30b and 30c are identical thereto. Positive and negative switch assemblies 34 and 36 are coupled in series across the DC link conductors 20a, 20b. A phase output is produced at a terminal 38 which comprises the junction between the switch assemblies 34 and 36. A neutral switch assembly 40 is coupled between the phase output terminal 38 and the neutral terminal 32.

The switch assemblies 34, 36, 40 are operated to produce an AC waveform at the output terminal 38 comprising a series of alternating positive and negative half-cycles. The positive half-cycle is produced by alternately operating the switch assemblies 34 and 40 in a pulse-width modulated (PWM) mode. Each negative half-cycle is produced by alternately operating the switch assemblies 36 and 40 in a PWM mode. The output voltage produced at the terminal 38 thus switches between a positive or negative level and the neutral voltage, but not between the positive and negative levels. The inverter is thus referred to as being of the neutral point clamped type. It should be noted that inverter 22 need not be of this type, in which case the neutral switch assembly 40 of the leg 30a and the corresponding neutral switch assemblies of the legs 30b and 30c would not be needed. In this case, the switch assemblies 34 and 36 may be alternately operated in a PWM mode or may be operated to produce a stepped output waveform, if desired.

Figure 4:
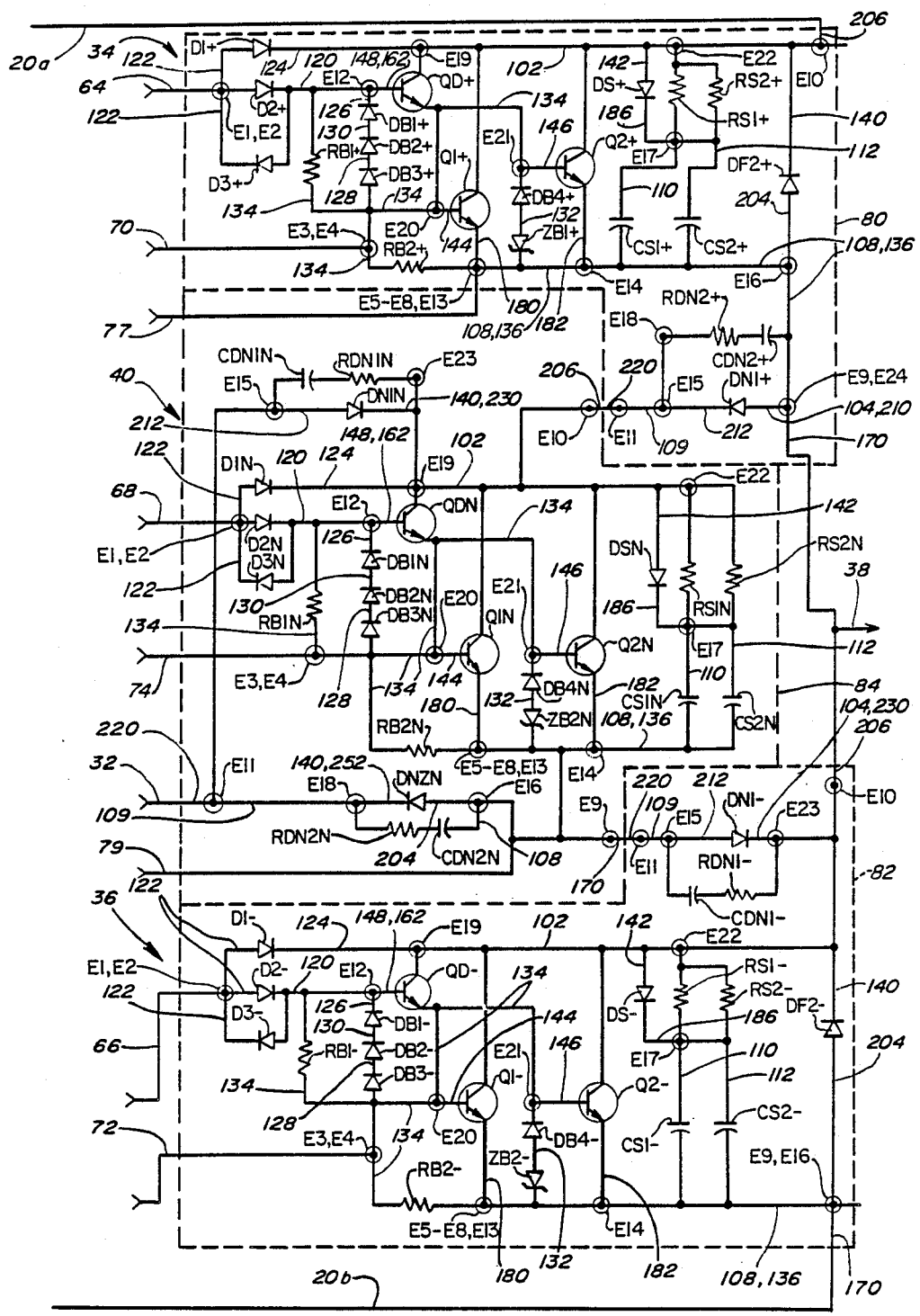
FIG. 4 comprises a schematic diagram of power switches together with base biasing, snubber and flyback circuitry of the inverter leg shown in block diagram form in FIG. 3.

Referring now to FIG. 4, the positive switch assembly 34 includes a driver transistor QD+ which is connected in a Darlington configuration with driven transistors Q1+ and Q2+. Connected to the bases of the transistors QD+, Q1+ and Q2+ is base biasing circuitry including diodes D1+ through D3+ and DB1+ through DB3+ together with biasing resistors RB1+ and RB2+. An additional diode DB4+ together with a zener diode ZB1+ are connected to the bases of the transistors Q1 and Q2.

Connected across the collectors and emitters of the driven transistors Q1+ and Q2+ are flyback and snubber circuits including a flyback diode DF2+, a snubber diode DS+, snubber resistors RS1+, RS2+ and snubber capacitors CS1+, CS2+.

The negative switch assembly 36 includes identical components described above in connection with the positive switch assembly 34. In order to distinguish between the components of the negative switch assembly and the components of the positive switch assembly, the plus signs in the reference designations for the components of the positive switch assembly 34 are replaced by negative signs for the components of the negative switch assembly 36.

The neutral switch assembly 40 includes base biasing components D1N through D3N, DB1N through DB4N, RB1N, RB2N and ZB2N, power switching components including a driver transistor QDN and driven transistors Q1N, Q2N and snubber components DSN, RS1N, RS2N, CS1N and CS2N. These components correspond to the components D1+ through D3+, DB1+ through DB4+, RB1+, RB2+, ZB2+, QD+, Q1+, Q2+, DS+, RS1+, RS2+, CS1+, and CS2+, respectively, of the positive switch assembly 34. In addition, the neutral switch assembly 40 includes diodes DN1+, DN1−, DN1N and DN2N, snubber resistors RDN2+, RDN1−, RDN1N and RDN2N and snubber capacitors CDN2+, CDN1−, CDN1N and CDN2N.

Current flow between the neutral terminal 32 and the phase output 38 is accomplished in a bi-directional fashion utilizing the diodes DN1+, DN1−, DN1N and DN2N, together with the switches QDN, Q1N and Q2N. More specifically, current flow from the phase output 38 to the neutral terminal 32 occurs through the diode DN1+, the transistors QDN, Q1N and Q2N and the diode DN2N. Conversely, current flow from the neutral terminal 32 to the phase output 38 takes place through the diode DN1N, the transistors QDN, Q1N and Q2N and the diode DN1−.

The switches of each switch assembly 34, 36 and 40 are turned on by positive base currents supplied over lines 64, 66 and 68, respectively. The switches are turned off by drawing current out of the bases of these transistors over the lines 64, 66 and 68 and through additional lines 70, 72 and 74 which are coupled to the bases of the driven transistors Q1+ and Q2+, Q1− and Q2− and Q1N and Q2N, respectively. Ground references for the switch assemblies 34 and 40 are provided over lines 77 and 79 while a ground reference is provided for the switch assembly 36 by the DC link conductor 20b. It should be understood that the circuitry for turning the transistors of these switch assemblies on and off is unimportant to an understanding of the present invention, and hence will not be described in detail herein.

The components of FIG. 4 may be packaged as three separate units as illustrated by the dashed lines of FIG. 4 which in turn leads to a desirable standardization of the units. More particularly, the diode DN1+, resistor RDN2+ and capacitor CDN2+ may be packaged on a circuit board 80 together with the power switches and the base biasing, snubber and flyback circuits of the switch assembly 34. The diode DN1−, capacitor CDN1− and resistor RDN1− may be packaged on a circuit board 82 together with the power switches and the base biasing, snubber and flyback circuits of the negative switch assembly 36. The diodes DN1N, DN2N, the capacitors CDN1N and CDN2N and the resistors RDN1N and RDN2N may be packaged on a single circuit board 84 with the power switches and the base biasing and snubber circuits of the neutral switch assembly 40. Inasmuch as the neutral switch assembly 40 does not require a flyback diode, it can be seen that such a packaging arrangement results in an identical number of components on each circuit board 80, 82 and 84, except that the board 84 includes an extra resistor and capacitor as compared with the boards 80 and 82. This arrangement of components allows the design of the board to be standardized so that a single board blank can be configured to form a positive switch assembly, a negative switch assembly or a portion of a neutral switch assembly, as desired.

Figure 5:
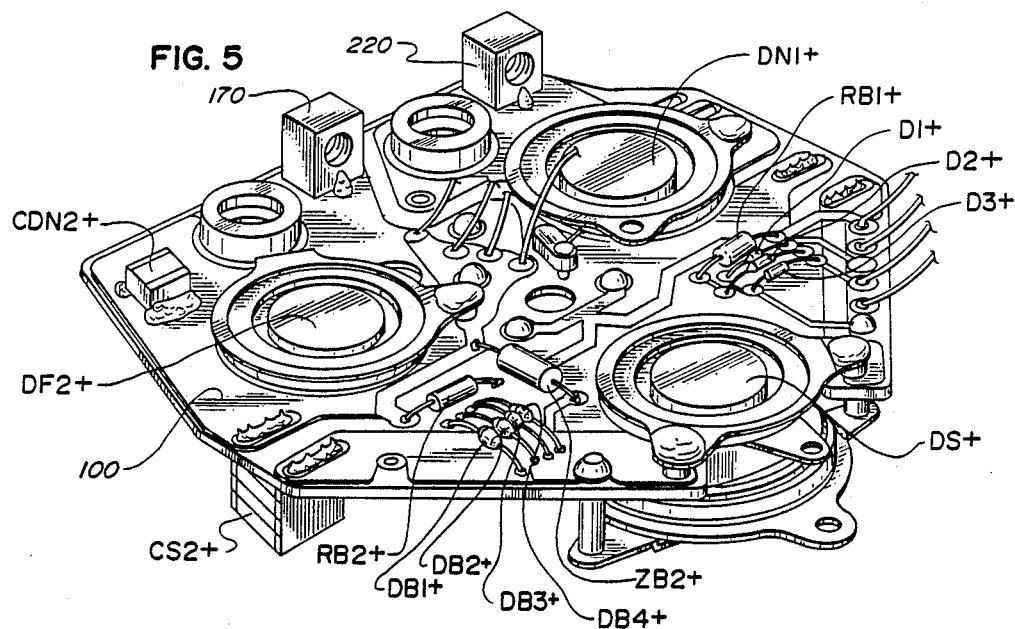
FIG. 5 is a perspective view of a first side of the circuit board of the present invention configured to form a positive switch assembly.
Figure 6:
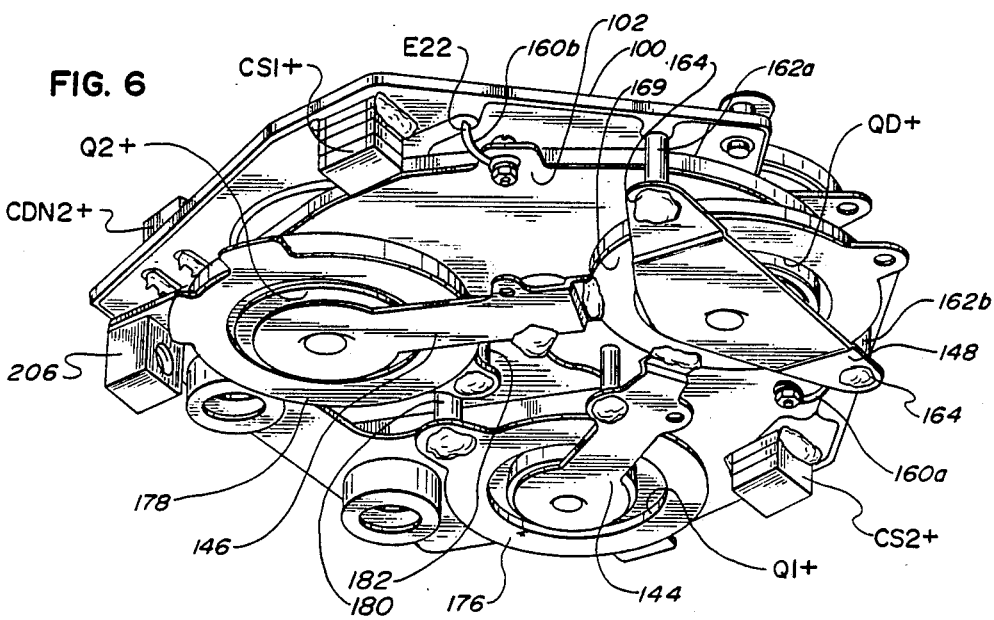
FIG. 6 is a perspective view of a second side of the circuit board of FIG. 5.

FIG. 5 illustrates the circuit board 80 in detail from a first or a top side thereof while FIG. 6 illustrates the board from a second or lower side thereof. As seen in these FIGS., the board includes a substrate 100 which is bonded to a heat exchanger 102. The heat exchanger 102 is electrically and thermally conductive and is preferably fabricated of aluminum. The heat exchanger 102 forms a collector bus for the switch assembly 34. As seen specifically in FIG. 7, the diodes DS+, DF2+ and DN1+ are disposed in apertures 103a–103c, respectively, through the substrate 100 in thermal contact with a first side of the heat exchanger 102 while the transistors QD+, Q1+ and Q2+ are disposed on in electrical and thermal contact with a second side of the heat exchanger 102. The diodes DS+ and DF2+ are directly electrically connected to the collector bus formed by the heat exchanger 102. As seen in the exploded view from the top side of FIG. 7, a conductive pad 104 and an electrically insulating Kapton spacer 105 are disposed between the anode of the diode DN1+ and the heat exchanger 102 so that the anode can be connected to other components in a fashion hereinafter described. "Kapton" is a registered trademark of E.I. duPont de Nemours and Company for flexible film for electrical insulation.

Figure 9:
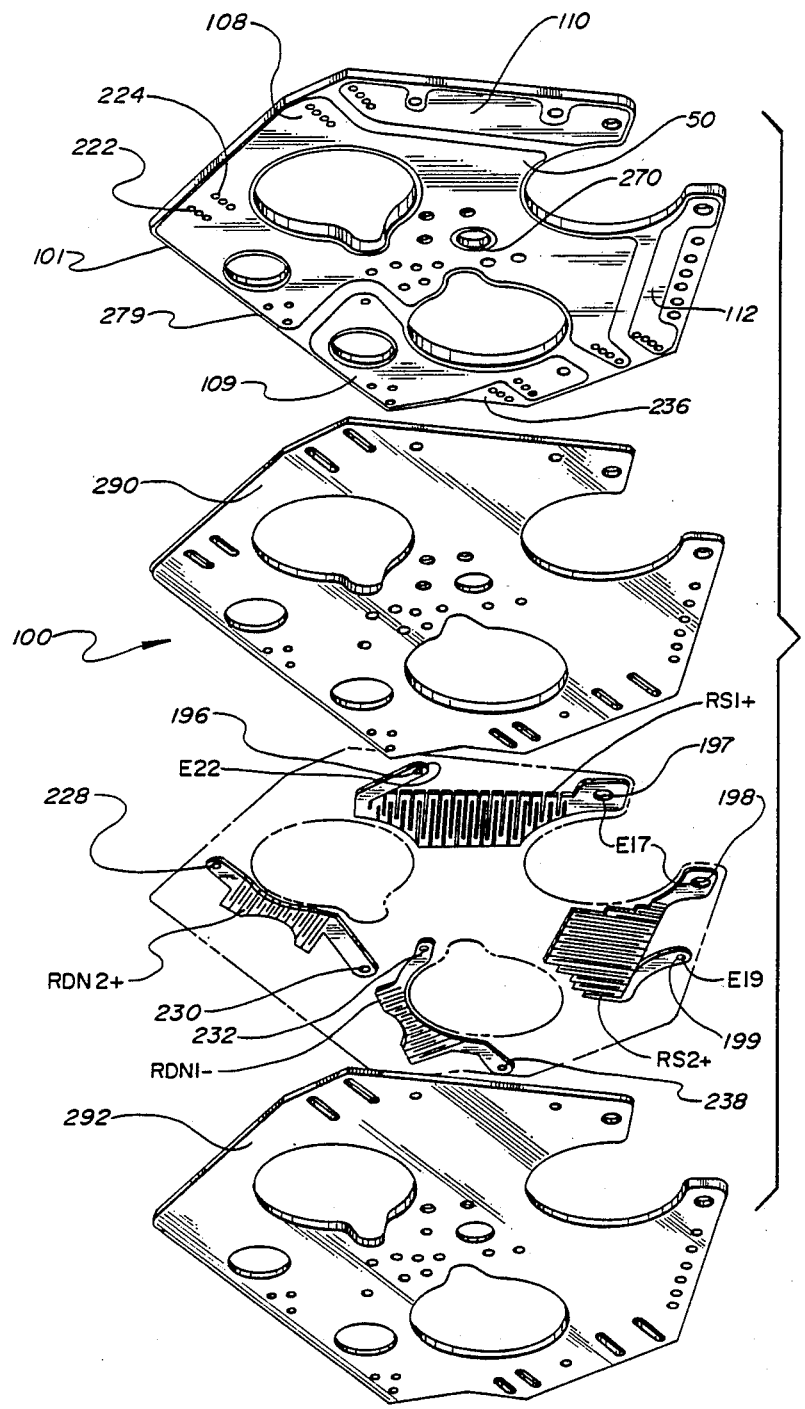
FIG. 9 comprises an exploded perspective view from the second side of the circuit board of FIG. 5 illustrating the remainder of the layers thereof.

The diodes D1+ through D3+, DB1+ through DB4+ and ZB1+, the resistors RB1+ and RB2+ and the capacitors CS1+, CS2+ and CDN2+ are mounted on the substrate 100. The resistors RS1+, RS2+ and RDN2+ comprise planar etched foil resistors which are formed as a layer by an etching process as part of the substrate 100 and are shown in FIG. 9. A series of conductive traces forming a trace layer 106 and a series of via holes 107 (several of which are identified in FIG. 7) are provided as a part of the substrate 100. The substrate 100 further includes a main layer 101 having three buses comprising an emitter bus 108, an input/output bus 109 and first and second capacitor buses 110, 112. Spaces between the buses 108, 109, 110 and 112 are occupied by electrically insulative filler material 114 and the portions are bonded together by a bonding agent, such as epoxy, to form the main layer 101. The filler material 114 may be a commercially available product known commonly as G10 material which conforms to military specification MILP13949.

Figure 10:
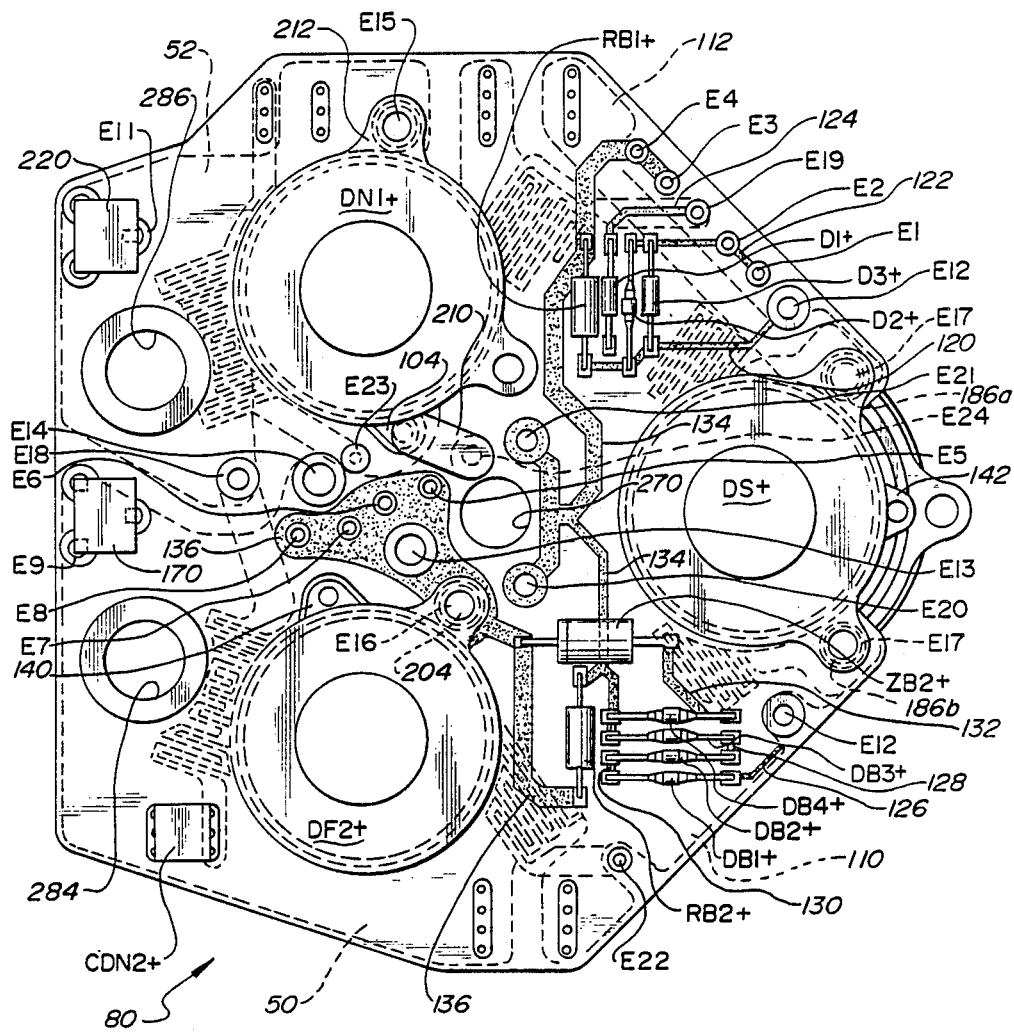
FIG. 10 comprises a plan view of the first side of the circuit board of FIG. 5.

The trace layer 106 includes a series of traces 120, 122, 124, 126, 128, 130, 132, 134 and 136 which, as noted in greater detail hereinafter, are deposited on the main layer 101, again by an etching process. The via holes 107, the traces 120–136, the buses 108, 109, 110 and 112, the heat exchanger 102, the conductive pad 104, additional conductive pads 140, 142 and electrically conductive plates 144, 146 and 148 interconnect the various components on the board 80. Various junction points in the schematic of FIG. 4 are identified by a number preceded by the letter E and are shown in FIGS. 9 and 10. The schematic of FIG. 4 also includes reference numerals identifying the interconnection of the components on the board by the conductive pads 104, 140, 142, the heat exchanger 102, the conductive traces 120–136, the buses 108, 109, 110 and 112 and the plates 144, 146 and 148 as well as conductive mounting posts hereinafter described.

More particularly, the trace 122 couples connection points E1 and E2 to the anodes of the diodes D1+ and D2+ and to the cathode of the diode D3+. The trace 124 couples the cathode of the diode D1+ to a connection point E19 which is in turn coupled by a wire 160a, FIG. 6, to the heat exchanger 102. A further connection point E22 is coupled to the heat exchanger 102 by a further wire 160b. The wires 160a, 160b are soldered to the connection points E19, E22 and are bolted to the heat exchanger 102.

The conductive trace 120, FIG. 10, connects the diodes D2+, D3+ and the resistor RB1+ to a connection point E12. The connection point E12 is also coupled by the conductive plate 148 and a pair of conductive mounting posts 162a, 162b, FIG. 6, to the base or control electrode of the driver transistor QD+. The mounting posts are secured to the substrate 100 and are soldered to the conductive plate 148 at points 164 to securely hold the emitter of the transistor QD+ in electrical contact with the heat exchanger 102.

The conductive traces 126, 128, 130 and 134, FIG. 10, connect the diodes DB1+ through DB3+ in series between the connection point E12 and a pair of connection points E3, E4. These latter two connection points are coupled to the line 70.

The conductive trace 134 also connects the resistor RB1+ to a pair of connection points E20 and E21. These connection points are coupled to the bases of the transistors Q1+ and Q2+ by the conductive plates 144, 146, FIGS. 6 and 7. The emitter of the transistor QD+ is coupled to the bases of the transistors Q1+ and Q2+ by soldering or otherwise electrically connecting the conductive plates 144, 146 to an emitter electrode 169 of the transistor QD+, as seen in FIG. 6.

The conductive traces 132, 136 connect the diodes DB4+ and ZB1+ between the connection point E21 and the emitter bus 108. The conductive trace 136 connects the emitter bus 108 to connection points E5–E8, E13, E14 and E16. In addition, a connection point E9 is coupled to the emitter bus 108 and a connector 170 is mounted on the board 80 which is in turn coupled to the phase output terminal 38. A connection point E24 is also coupled to the emitter bus 108.

As seen specifically in FIG. 6, emitter electrodes 176, 178 of the transistors Q1+ and Q2+, respectively, are coupled by electrically conductive mounting posts 180, 182, respectively, to the emitter bus 108.

Referring again to FIGS. 7 and 10, the conductive pad 142 connects the anode of the transistor DS+ to the heat exchanger 102. A cathode plate 183 of the diode DS+ is coupled by a pair of electrically conductive mounting posts 186a, 186b to a pair of connection points E17. The connection points E17 are in turn coupled to the capacitor buses 110, 112. The capacitor CS1+ is soldered into via holes 190, 192 so that the capacitor CS1+ is connected between the capacitor bus 110 and the emitter bus 108. In like fashion, the capacitor CS2+ is connected between the capacitor bus 112 and the emitter bus 108 by soldering the electrodes thereof into via holes 194, 195.

The holes 190 and 194 are plated through so that the capacitors CS1+ and CS2+ are connected by the buses 110, 112 to the etched foil resistors RS1+ and RS2+. As seen in FIG. 9, the resistor RS1+ includes terminals 196, 197 which are connected between connection points E17 and E22 whereas the resistor RS2+ includes terminals 198, 199 which are connected between the connection points E17 and E19.

The cathode of the diode DF2+ is connected by the electrically conductive pad 140 to the heat exchanger 102. An anode terminal 200 of the diode DF2+ is coupled by an electrically conductive post 204, FIG. 7, to the emitter bus 108.

A connector 206 comprises a part of the heat exchanger 102 and comprises a connection point E10. In the case of the board 80, the connector 206 provides a means for connecting the DC link conductor 20a to the heat exchanger 102.

Figure 7:
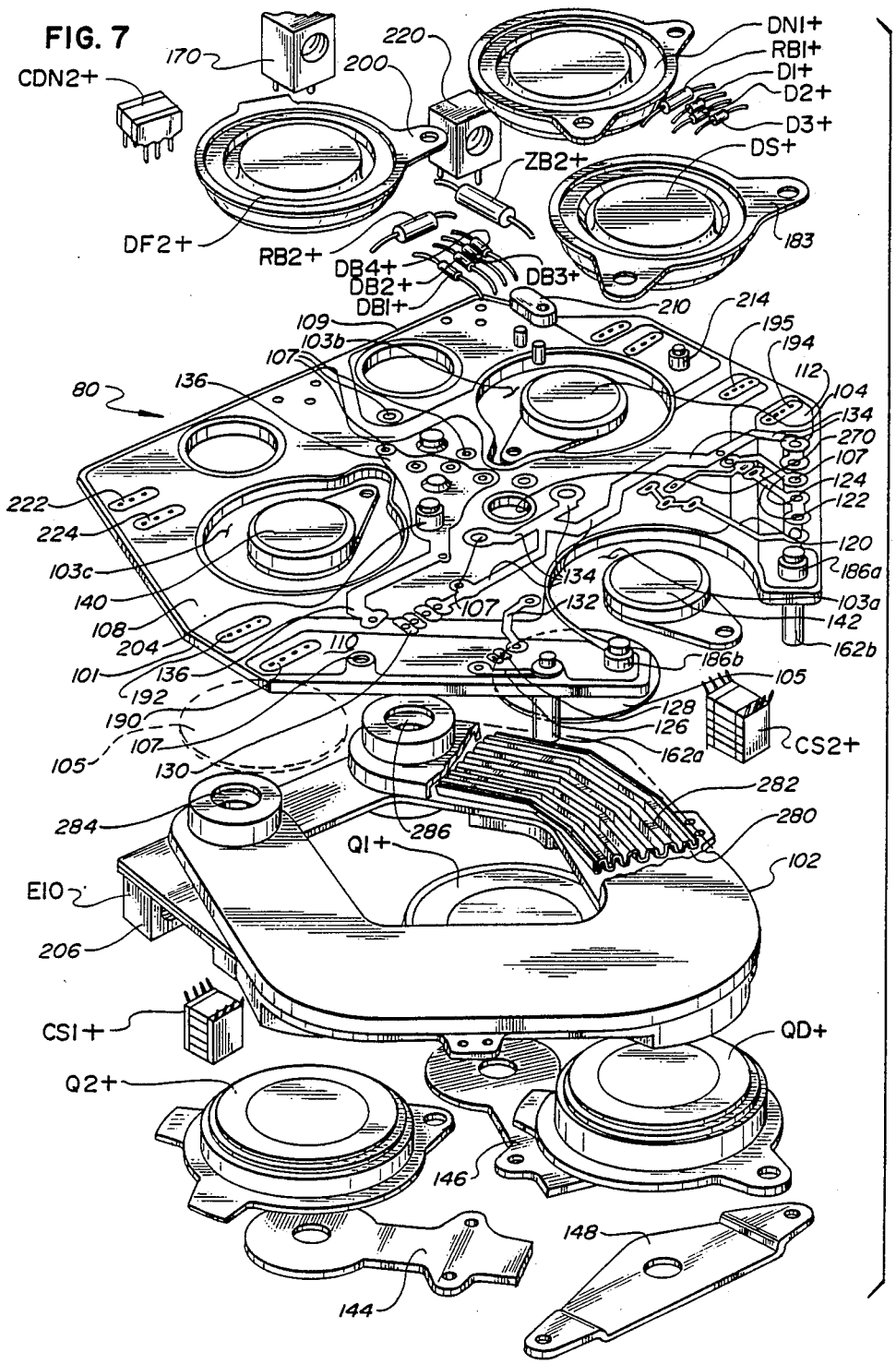
FIG. 7 comprises an exploded perspective view of the circuit board of FIG. 5 illustrating various electrical components separated from the circuit board.

An anode of the diode DN1+, FIGS. 7 and 10, is coupled by the conductive pad 104 and a jumper 210 to the connection point E24. A cathode electrode 212 of the diode DN1+ is coupled to an electrically conductive mounting post 214 which is shown in detail in FIG. 7. The connection point E15 is in turn coupled to the input/output bus 109, as are connection points E11 and E18. As seen in FIG. 10, a connector 220 is coupled to the input/output bus 109 to allow the board 80 to be connected to the board 84.

The capacitor CDN2+ is soldered into via holes 222 and 224 which, as seen in FIG. 9, extend through the emitter bus 108 into the thermofoil resistor layer. The via holes 224 are not plated fully through the board 80 so that the pins of the capacitor CDN2+ soldered therein do not make electrical contact with the emitter bus 108. These pins of the capacitor do, however, establish electrical contact with a terminal 228 of the etched foil resistor RDN2+ so that the capacitor CDN2+ is coupled between the emitter bus and such resistor.

A second terminal 230 of the resistor RDN2+ is coupled to the connection point E18, which is in turn coupled by the input/output bus 109 to the connection point E11.

Figure 11:
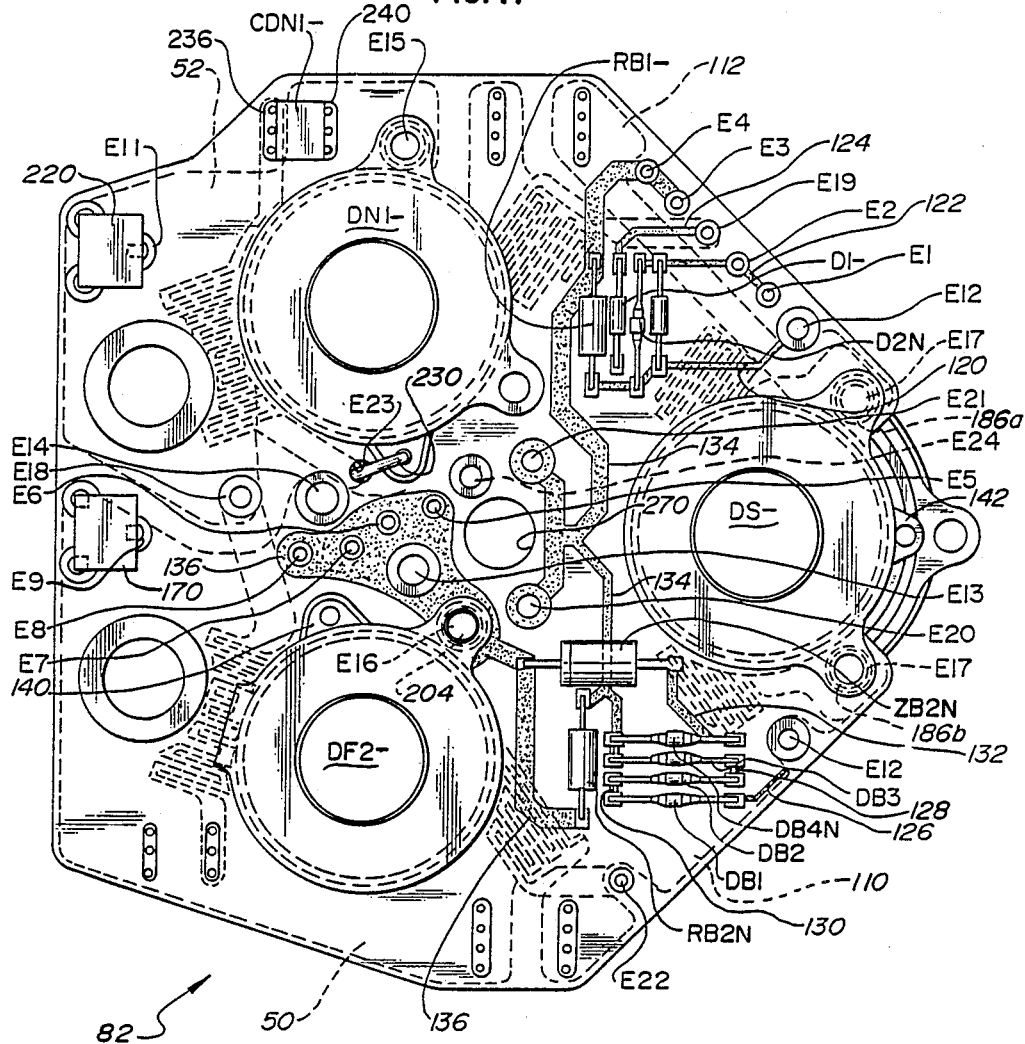
FIG. 11 comprises a plan view of the first side of the circuit board of the present invention configured to form a negative switch assembly.

Referring now to FIG. 11, the board 82 for the negative switch assembly 36 is identical to the board 80 with the following exceptions. Elements common to FIGS. 10 and 11 are assigned like reference numerals with the exception of electrical components wherein a minus sign is substituted for a plus sign, as noted previously.

The diode DN1— is turned over as compared with the diode DN1+ so that the anode of the diode DN1— is coupled to the connection point E15. Further, the electrically insulating spacer 105 is not used so that the cathode of the diode DN1— is coupled electrically and thermally to the heat exchanger 102.

The jumper 210 is not utilized in the negative switch assembly of FIG. 11. Rather, a jumper 230 connects the electrically conductive pad 104, and hence the cathode of the diode DN1—, to a connection point E23 which is in turn coupled to a first terminal 232 of the etched foil resistor RDN1—, seen in FIG. 9. A capacitor CDN1— includes pins which extend through via holes 236 to connect to a second terminal 238 of the resistor 20 RDN1—. A second set of pins of the capacitor CDN1— extend through via holes 240 to establish electrical contact with the input/output bus 109.

The capacitor CDN2+ is not used in the negative switch assembly 36. By omitting this capacitor, the resistor RDN2+ is likewise not used.

Figure 12:
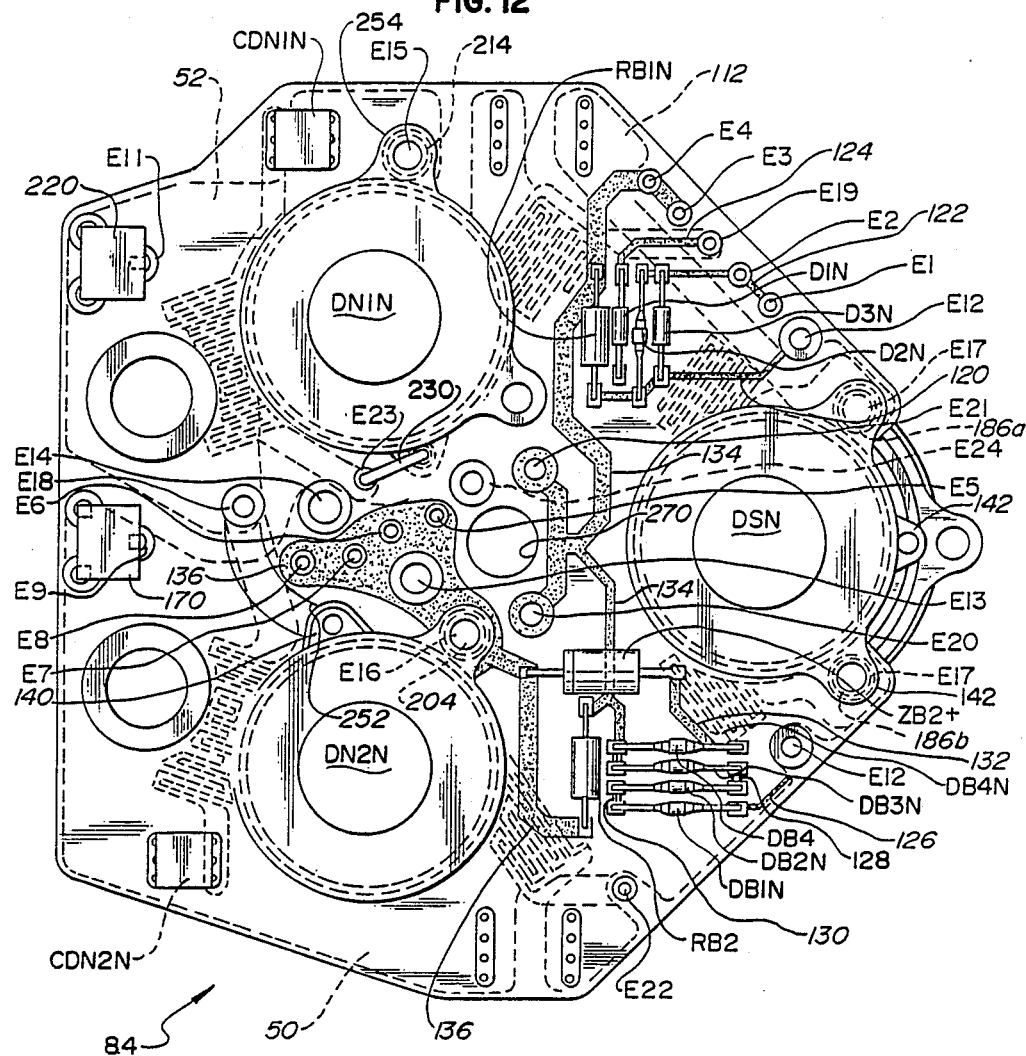
FIG. 12 comprises a plan view of the first side of the circuit board of the present invention to form a portion of a neutral switch assembly.

Referring now to FIG. 12, the circuit board 84 forming a portion of the neutral switch assembly is illustrated in greater detail. Again, elements common between FIGS. 10 and 12 are assigned like reference numerals, with the exception that electrical components are identified by the suffix N instead of the plus sign. As before, only the differences between the boards 80 and 84 will be described in detail.

The insulating spacer 105 is not used in the board 84 so that the cathode of a diode DN1N is coupled to the heat exchanger 102. Instead, the electrically insulating spacer 105 shown in phantom in FIG. 7 is placed between the conductive pad 140 and the heat exchanger 102 so that the cathode of a diode DN2N is insulated therefrom. An electrically conductive jumper 252 connects the cathode to the connection point E18. This connection point is in turn coupled by the input/output bus 109 to a capacitor CDN1N and an anode electrode 254 of a diode DN1N via the mounting post 214. The diode DN1N is turned upside down as compared with the diode DN1+ of the board 80 so that the cathode electrode thereof faces and is in electrical contact with the heat exchanger 102. The cathode electrode of the diode DN1N and the heat exchanger 102 are coupled by the conductive pad 140 and the jumper 230 to the connection point E23.

The capacitor CDN1N is coupled between the connection point E15 and the resistor RDN1N. A capacitor CDN2N is coupled to the anode of the diode DN2N by the emitter bus 108 at the connection point E16. The resistor RDN2N is connected between the capacitor CDN2N and the connection point E18.

Referring again to FIG. 4, the boards 80, 82 and 84 are interconnected by wires or other conductors such that the connection point E11 of the board 80 is connected to the connection point E10 of the board 84 using the connectors 220 and 206 and so that the connection point E11 of the board 82 is connected to the connection point E9 of the board 84 using the connectors 220 and 170. The phase output terminal 38 is coupled to the connection point E24 of the board 80 via the connector 170 and to the connection point E10 of the board 82 via the connector 206. The DC link conductor 20a is coupled to the connection point E10 of the board 80 using the connector 206. The DC link conductor 20b is coupled to the emitter bus 108 of the board 82 using the connector 170. The neutral terminal 32 is coupled to the connection point E11 of the board 84 by the connector 220. The lines 64, 66, 68, 70, 72, 74, 77 and 79 are coupled to the respective boards 80, 84 using wires or other conductors which are soldered or otherwise electrically connected to the respective connection points thereof.

If desired, the boards 80, 82 and 84 may be arranged in a stacked configuration with electrically insulating sheets or spacers therebetween which may be made of Kapton or another suitable material. In such case, a threaded bar or rod (not shown) may extend through aligned holes 270 in the boards, 80, 82 and 84 and through aligned holes in electrically insulating end caps (not shown) which are disposed adjacent the outer faces of the resulting stacked boards 80-84. Nuts (not shown) may be threaded on to the threaded bar to move the end caps toward one another to thereby force the diodes and capacitors into intimate contact with the heat exchangers 102 so that good electrical contact is made therebetween.

As seen in FIG. 7, the heat exchanger 102 includes a passage 280 having a plurality of cooling fins 282 disposed therein. Cooling oil or other cooling fluid enters one of two ports 284, 286 and exits the other port. When the boards 80, 82 and 84 are assembled in stacked relation, the ports 284, 286 of the boards 80, 84 may be interconnected so that the heat exchangers 102 are effectively coupled in parallel to receive cooling medium.

Figure 8:
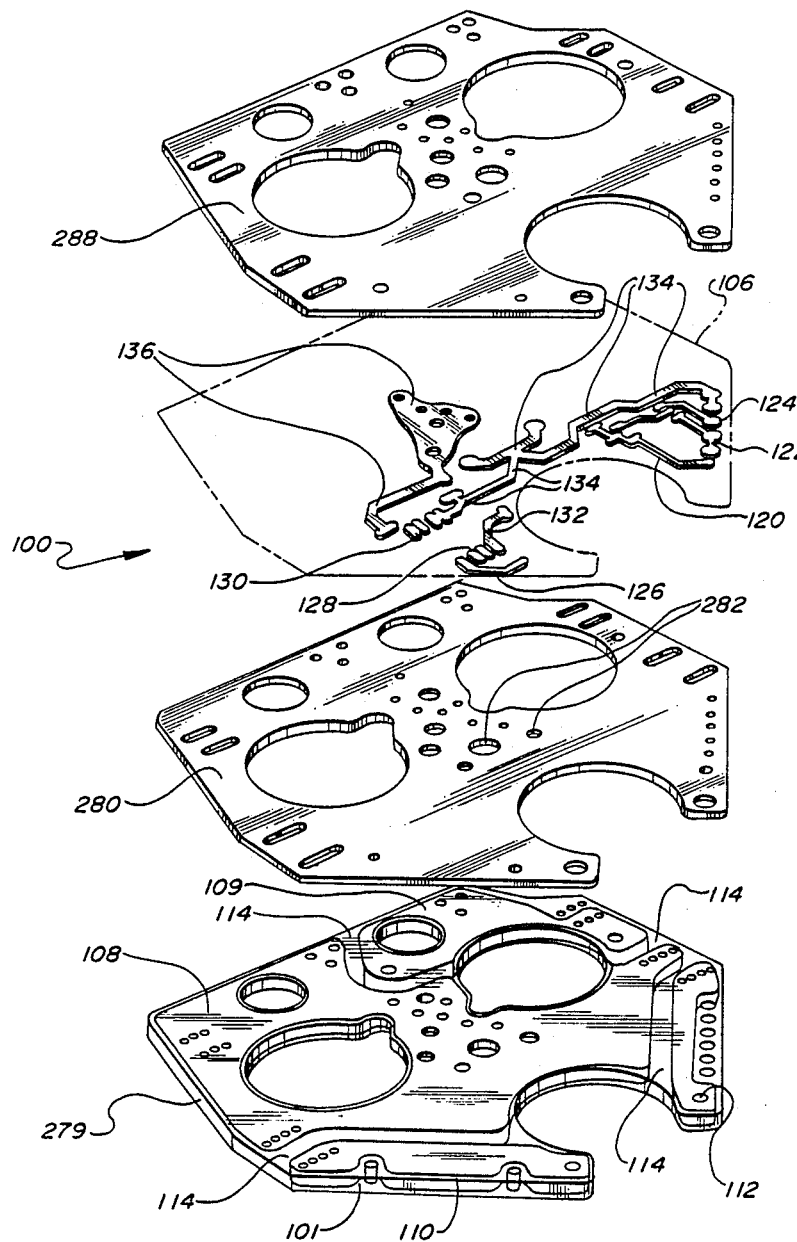
FIG. 8 comprises an exploded perspective view from the first side of the circuit board of FIG. 5 illustrating several of the layers thereof.

FIGS. 8 and 9 illustrate the construction of the substrate 100 in greater detail. The main layer 101 comprises the buses 108, 109, 110 and 112 together with the filler 114 and the epoxy. A first or upper side of the main layer 101 is covered with an electrically insulating coating 280 which has been etched as required, for example at areas 282. The electrically conductive traces 120-136 are then formed on the insulating layer 280 and a further insulating layer 288 is formed atop the traces 120-136. Again, the layer 288 is etched where necessary to allow connections to the traces and to other electrical components of the board.

As seen in FIG. 9, a still further electrically insulating layer 290 is deposited on a second or lower side of the first layer 101, again with portions etched where necessary. A layer of electrically resistive material is then deposited on the layer 290 and portions thereof are etched to form the etched foil resistors. Finally, an electrically insulating layer 292 is deposited over the etched foil resistors to insulate same. The layer 292 is etched where necessary to allow connections between the electrical components of the various layers.

As seen in the Figures, the main layer 101 occupies the majority of the thickness of the substrate 100 so that the buses 108, 109, 110 and 112 and filler 114 extend substantially the entire distance between first and second faces of the substrate 100. These portions provide mechanical rigidity for the circuit boards 80, 82 and 84.

In the preferred embodiment, the value and rating of corresponding components on the boards 80, 82 and 84 are the same so that the boards can be manufactured and shipped with such components thereon. Such a board blank may then be configured for a positive switch assembly 34 by adding the insulating pad 105, the jumper 210 and the capacitor CDN2+, as noted in greater detail above. The board could alternatively be configured as the negative switch assembly 36 by adding the jumper 230 and the capacitor CDN1− and by reversing the diode DN1 − as compared with the diode DN1+ or may be configured as a neutral switch assembly 40 by adding the jumpers 230 and 252, the insulating pad 250 and the capacitors CDN1N, CDN2N and by reversing the diode DN1N as compared with the diode DN1+.

It can thus be seen that a "generic" board or board blank can be provided with components mounted thereon which are common to the positive, negative and neutral switch assemblies, together with additional components which would allow the board to be configured as one of the positive or negative switch assemblies or as a portion of the neutral switch assembly. This desirable standardization simplifies replacement of boards containing one or more faulty components and obviates the need to stock separate replacement boards for each switch assembly. A significant reduction in inverter down time and inventory cost may thus be realized.

We claim:

1. A circuit board for an inverter, comprising:
   a substrate including a main layer having two separate electrically conductive buses, first and second layers of electrically insulating material disposed on first and second sides of the main layer, respectively, a series of traces disposed on the first layer of electrically insulating material, a third layer of electrically insulating material on the series of traces, a planar resistor disposed on the second layer of electrically insulating material and a fourth layer of electrically insulating material disposed on the planar resistor;
   a plurality of resistors and diodes interconnected by the traces and disposed atop the third layer of electrically insulating material;
   a capacitor disposed atop the fourth layer of insulating material and electrically coupled on one of the substrate buses between the planar resistor and one of the substrate buses;
   an electrically conductive heat exchanger disposed on the fourth layer of electrically insulating material and coupled to the planar resistor; and
   a power transistor and a power diode both in electrical and thermal contact with the heat exchanger and further in electrical contact with the other of the buses of the main layer.

2. The switch assembly of claim 1, including a further capacitor and a further planar resistor coupled together in series between the heat exchanger and the other of the buses of the main layer, the further capacitor being disposed atop the fourth layer of insulating material and the planar resistor being disposed between the second and fourth layers of electrically insulating material.

3. The switch assembly of claim 1, wherein the heat exchanger includes first and second faces wherein the power transistor is in contact with the first face and the power diode is disposed within an aperture through the substrate in contact with the second face.

* * * * *